United States Patent
Hsiao et al.

(10) Patent No.: US 9,653,558 B2
(45) Date of Patent: May 16, 2017

(54) SEMICONDUCTOR STRUCTURE HAVING A DUMMY CONTACT AND MANUFACTURING METHOD THEREOF

(71) Applicant: UNITED MICROELECTRONICS CORP., Hsinchu (TW)

(72) Inventors: Shih-Yin Hsiao, Chiayi County (TW); Kai-Kuen Chang, Keelung (TW); Kun-Huang Yu, New Taipei (TW)

(73) Assignee: UNITED MICROELECTRONICS CORP., Hsinchu (TW)

(*) Notice: Subject to any disclaimer, the term of this patent is extended or adjusted under 35 U.S.C. 154(b) by 4 days.

(21) Appl. No.: 14/739,702

(22) Filed: Jun. 15, 2015

(65) Prior Publication Data
US 2016/0336410 A1    Nov. 17, 2016

(30) Foreign Application Priority Data

May 15, 2015    (CN) .......................... 2015 1 0247125

(51) Int. Cl.
| *H01L 27/088* | (2006.01) |
| *H01L 29/40* | (2006.01) |
| *H01L 21/762* | (2006.01) |
| *H01L 29/66* | (2006.01) |
| *H01L 29/78* | (2006.01) |
| *H01L 29/06* | (2006.01) |
| *H01L 29/423* | (2006.01) |
| *H01L 29/10* | (2006.01) |

(52) U.S. Cl.
CPC .......... *H01L 29/404* (2013.01); *H01L 21/762* (2013.01); *H01L 29/0653* (2013.01); *H01L 29/66659* (2013.01); *H01L 29/7835* (2013.01); *H01L 29/1045* (2013.01); *H01L 29/42368* (2013.01)

(58) Field of Classification Search
CPC . H01L 29/404; H01L 29/0653; H01L 21/762; H01L 29/66659; H01L 29/7835; H01L 29/1045; H01L 29/42368; H01L 29/66545; H01L 29/66681; H01L 29/7816
See application file for complete search history.

(56) References Cited

U.S. PATENT DOCUMENTS

| 6,069,076 | A | * | 5/2000 | Takahashi | ........... H01L 23/5254 257/E23.148 |
| 8,704,304 | B1 | | 4/2014 | Yu | |
| 8,766,358 | B2 | | 7/2014 | Lee et al. | |
| 9,349,818 | B2 | * | 5/2016 | Yu | ........................ H01L 29/4238 |
| 9,391,196 | B1 | * | 7/2016 | Chang | ................... H01L 29/402 |
| 2012/0181671 | A1 | * | 7/2012 | Hashimi | ................. H01L 22/12 257/620 |

OTHER PUBLICATIONS

U.S. Appl. No. 14/519,153, Title Metal-Oxide-Semiconductor Transistor Device and Manufacturing Method Thereof, filed Oct. 21, 2014.

* cited by examiner

*Primary Examiner* — Thanh Y Tran
(74) *Attorney, Agent, or Firm* — WPAT, PC; Justin King (57) ABSTRACT

A semiconductor structure and a manufacturing method thereof are provided. The semiconductor structure includes a substrate, a source region, a drain region, a gate, and a dummy contact. The source region and the drain region are formed in the substrate. The gate is formed on the substrate and between the source region and the drain region. The dummy contact includes a plurality of dummy plugs formed on the substrate, wherein the dummy plugs have depths decreasing towards the drain region.

20 Claims, 8 Drawing Sheets

SEMICONDUCTOR STRUCTURE HAVING A DUMMY CONTACT AND MANUFACTURING METHOD THEREOF

This application claims the benefit of People's Republic of China Application Serial No. 201510247125.9, filed May 15, 2015, the subject matter of which is incorporated herein by reference.

BACKGROUND

Technical Field

The disclosure relates in general to a semiconductor structure and a manufacturing method thereof, and more particularly to a semiconductor structure having high breakdown voltage and a manufacturing method thereof.

Description of the Related Art

Integrated circuits (IC) technologies have been progressed in feature size and integration density as well as in integrating various MOS transistor devices into one chip (or die). For example, HV MOS transistor devices and mixed-signal circuit may be combined together for various applications. For working in the high voltage condition, such as a lateral diffused MOSFET transistor (LDMOS) capable of withstanding a high voltage, it is known that the breakdown voltage (BVD) and reliability are key factors for the HV MOS transistor device.

However, the manufacturing process as well as the structure of a LDMOS is critical to its operations and functions. Therefore, there is always a continuing need to provide an improved high voltage semiconductor device as well as the manufacturing process thereof.

SUMMARY OF THE INVENTION

The disclosure is directed to a semiconductor structure and a manufacturing method thereof. According to the embodiments of the present disclosure, the dummy plugs of the dummy contact have depths decreasing towards the drain region, such that the electric field distribution can be effectively dispersed, thereby increasing the breakdown voltage.

According to an embodiment of the present disclosure, a semiconductor structure is disclosed. The semiconductor structure includes a substrate, a source region, a drain region, a gate, and a dummy contact. The source region and the drain region are formed in the substrate. The gate is formed on the substrate and between the source region and the drain region. The dummy contact is formed on the substrate, and the dummy contact includes a plurality of dummy plugs, wherein the dummy plugs have depths decreasing towards the drain region.

According to another embodiment of the present disclosure, a manufacturing method of a semiconductor structure is disclosed. The manufacturing method of the semiconductor structure includes the following steps: providing a substrate; forming a source region and a drain region in the substrate; forming a gate on the substrate and between the source region and the drain region; and forming a dummy contact on the substrate, the dummy contact comprising a plurality of dummy plugs, wherein the dummy plugs have depths decreasing towards the drain region.

The disclosure will become apparent from the following detailed description of the preferred but non-limiting embodiments. The following description is made with reference to the accompanying drawings.

DETAILED DESCRIPTION OF THE INVENTION

According to the embodiments of the present disclosure, in the semiconductor structure, the dummy plugs of the dummy contact have depths decreasing towards the drain region, such that the electric field distribution can be effectively dispersed, thereby increasing the breakdown voltage. The identical or similar elements of the embodiments are designated with the same reference numerals. It is to be noted that the drawings are simplified for clearly describing the embodiments, and the details of the structures of the embodiments are for exemplification only, not for limiting the scope of protection of the disclosure. Ones having ordinary skills in the art may modify or change the structures according to the embodiments of the present disclosure.

Figure 1A:
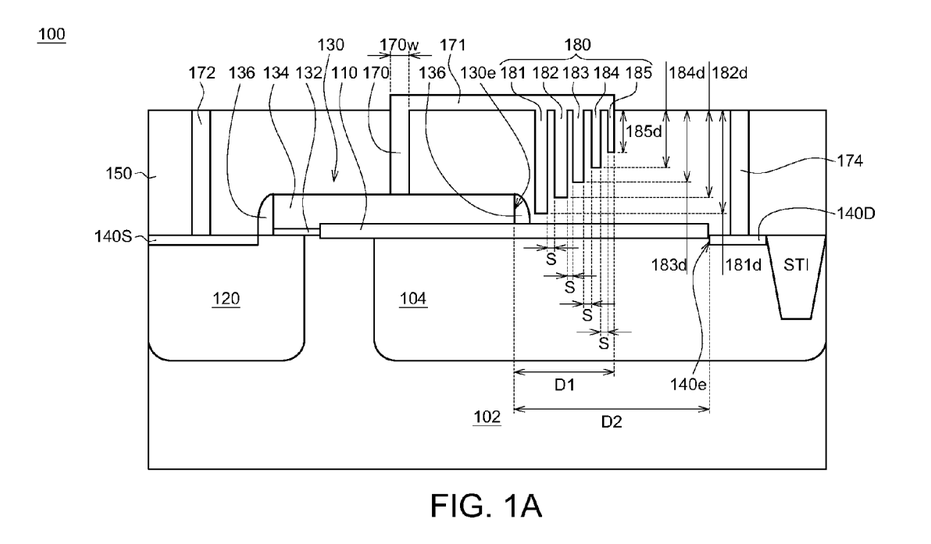
FIG. 1A is a cross-sectional view of a semiconductor structure according to an embodiment of the present disclosure.
Figure 1B:
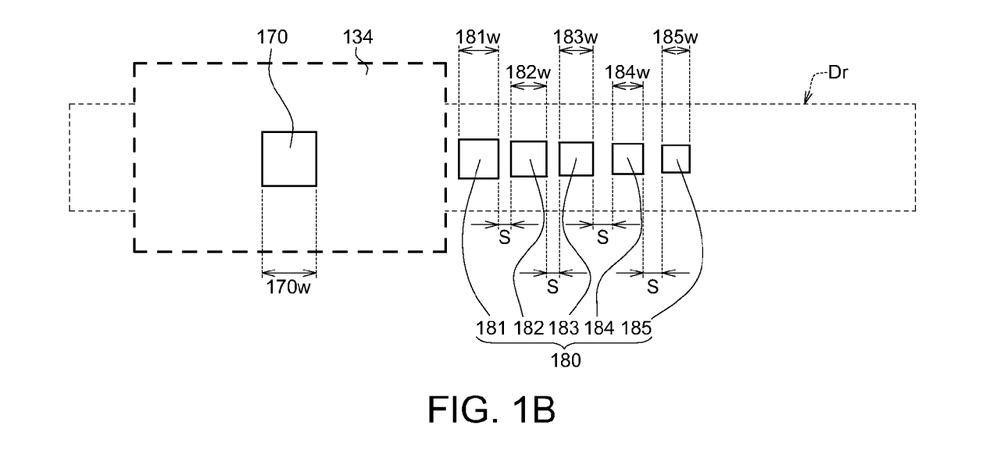
FIG. 1B is a partial top view of a semiconductor structure according to an embodiment of the present disclosure.

FIG. 1A is a cross-sectional view of a semiconductor structure 100 according to an embodiment of the present disclosure, and FIG. 1B is a partial top view of a semiconductor structure 100 according to an embodiment of the present disclosure. As shown in FIGS. 1A-1B, the semiconductor structure 100 includes a substrate 102, a drain region 140D, a source region 140S, a gate 130, and a dummy contact 180. The drain region 140D and the source region 140S are formed in the substrate 102. The gate 130 is formed on the substrate 102 and located between the drain region 140D and the source region 140S. The dummy contact 180 is formed on the substrate 102. The dummy contact 180 includes a plurality of dummy plugs, and these dummy plugs have depths decreasing towards the drain region 140D.

For example, as shown in FIG. 1A, in the present embodiment, the dummy contact 180 includes five dummy plugs 181-185, and these dummy plugs 181-185 respectively have depths 181$d$-185$d$. The depth 181$d$ which is farthest away from the drain region 140D is the biggest, the depths gradually decrease from the depth 181$d$ towards the depth 185$d$, and the depth 185$d$ which is closest to the drain region 140D is the smallest.

In the embodiment, the semiconductor structure 100 further includes a dielectric structure 150 formed on the substrate 102, and the dummy plugs are formed in the dielectric structure 150. The dielectric structure 150 is such as an interlayer dielectric (ILD).

In the embodiment, the drain region 140D and the source region 140S have a first type conductivity, such as N-type conductivity, and the substrate 102 has a second type conductivity, such as P-type conductivity. The dummy plugs are formed of a conductive material, such as polysilicon or tungsten.

As shown in FIG. 1A, among the dummy plugs, the one with the smallest depth is separated from an edge 130$e$ of the gate 130 by a first distance D1, the edge 130e of the gate 130 is separated from an edge 140e of the drain region 140D by a second distance D2, and a ratio of the first distance D1 to the second distance D2 is equal to or small than ⅔. For example, in the present embodiment, the dummy contact 180 includes five dummy plugs 181-185, and the first distance D1 is the distance between the dummy plug 185 having the smallest depth and the edge 130e of the gate 130.

In some embodiments, the first distance D1 between the dummy plug with the smallest depth and the edge 130e of the gate 130 may vary according to the number of the dummy plugs. For example, taking the second distance D2 between the edge 130e of the gate 130 and the edge 140e of the drain region 140D being 3.0 μm as an example, when the number of the dummy plugs is four (that is, the dummy contact 180 includes four dummy plugs), the first distance D1 is such as 0.79 μm; when the number of the dummy plugs is five, the first distance D1 is such as 1.01 μm; when the number of the dummy plugs is six, the first distance D1 is such as 1.22 μm; when the number of the dummy plugs is seven, the first distance D1 is such as 1.42 μm; when the number of the dummy plugs is eight, the first distance D1 is such as 1.82 μm; when the number of the dummy plugs is nine, the first distance D1 is such as 2.07 μm.

In the embodiment, the number of the dummy plugs is at least two. In some embodiments, when the number of the dummy plugs is at least three, any two of the adjacent dummy plugs are separated by a spacing S. In one embodiment, the spacings between the dummy plugs may be the same. That is, when the dummy contact 180 includes 3 dummy plugs, two spacings S are located between the three dummy plugs, and these two spacings S may be substantially the same, which means the three dummy plugs are arranged with equidistant intervals. For example, in one embodiment, in the structure as shown in FIG. 1A, the dummy contact 180 includes five dummy plugs 181-185, and the four spacings S between the dummy plugs may be substantially the same.

In some embodiments, the depths of the dummy plugs are decreasing towards the drain region 140D by such as a depth interval, and the depth interval is, for example, 0.01-0.2 μm. In other words, the depth interval represents the difference between the depths of two adjacent dummy plugs. For example, in the embodiment as shown in FIG. 1A, the depth 181d of the dummy plug 181 is different from the depth 182d of the dummy plug 182 by 0.01-0.2 μm, the depth 182d of the dummy plug 182 is different from the depth 183d of the dummy plug 183 by 0.01-0.2 μm, the depth 183d of the dummy plug 183 is different from the depth 184d of the dummy plug 184 by 0.01-0.2 μm, and the depth 184d of the dummy plug 184 is different from the depth 185d of the dummy plug 185 by 0.01-0.2 μm. At least two of these depth intervals may be the same, these depth intervals may be all the same, or these depth intervals may be all different from one another.

In some embodiments, the depths of the dummy plugs are decreasing by such as a depth decreasing ratio, and the depth decreasing ratio is, for example, 1-30%. The depth decreasing ratio is defined as a difference between the two depths to the larger one of the two depths of any two adjacent ones of the dummy plugs. In other words, the depth decreasing ratio represents the depth decrease ratio between two adjacent dummy plugs. For example, in the embodiment as shown in FIG. 1A, a ratio of the difference between the depth 181d of the dummy plug 181 and the depth 182d of the dummy plug 182 with respect to the depth 181d of the dummy plug 181 is 1%-30%; that is, the depth 182d of the dummy plug 182 is decreased by 1%-30% with respect to the depth 181d of the dummy plug 181, and the depth 182d of the dummy plug 182 is 70%-99% of the depth 181d of the dummy plug 181. Similarly, a ratio of the difference between the depth 182d of the dummy plug 182 and the depth 183d of the dummy plug 183 with respect to the depth 182d of the dummy plug 182 is 1%-30%, a ratio of the difference between the depth 183d of the dummy plug 183 and the depth 184d of the dummy plug 184 with respect to the depth 183d of the dummy plug 183 is 1%-30%, and a ratio of the difference between the depth 184d of the dummy plug 184 and the depth 185d of the dummy plug 185 with respect to the depth 184d of the dummy plug 184 is 1%-30%. At least two of the actual values of these depth decreasing ratios may be the same, the actual values of these depth decreasing ratios may be all the same, or the actual values of these depth decreasing ratios may be all different from one another.

As shown in FIG. 1B, which shows a top view the dummy plugs 181-185 corresponding to the diffusion region Dr of the semiconductor structure. In the embodiment, the dummy plugs have widths decreasing towards the drain region 140D.

For example, as shown in FIG. 1B, in the present embodiment, the dummy contact 180 includes five dummy plugs 181-185, and these dummy plugs 181-185 respectively have widths 181w-185w. The width 181w which is farthest away from the drain region 140D is the biggest, the widths gradually decrease from the width 181d towards the width 185w, and the width 185w which is closest to the drain region 140D is the smallest.

In some embodiments, the widths of the dummy plugs are decreasing towards the drain region 140D by such as a width interval, and the width interval is, for example, 0.01-0.1 μm. In other words, the width interval represents the difference between the widths of two adjacent dummy plugs. For example, in the embodiment as shown in FIG. 1B, the width 181w of the dummy plug 181 is different from the width 182w of the dummy plug 182 by 0.01-0.1 μm, the width 182w of the dummy plug 182 is different from the width 183w of the dummy plug 183 by 0.01-0.1 μm, the width 183w of the dummy plug 183 is different from the width 184w of the dummy plug 184 by 0.01-0.1 μm, and the width 184w of the dummy plug 184 is different from the width 185w of the dummy plug 185 by 0.01-0.1 μm. The actual values of these width intervals are gradually decreasing.

In some embodiments, the widths of the dummy plugs are decreasing by such as a width decreasing ratio, and the width decreasing ratio is, for example, 5-80%. The width decreasing ratio is defined as a difference between the two widths to the larger one of the two widths of any two adjacent ones of the dummy plugs. In other words, the width decreasing ratio represents the width decrease ratio between two adjacent dummy plugs. For example, in the embodiment as shown in FIG. 1B, a ratio of the difference between the width 181w of the dummy plug 181 and the width 182w of the dummy plug 182 with respect to the width 181w of the dummy plug 181 is 5%-80%; that is, the width 182w of the dummy plug 182 is decreased by 5%-80% with respect to the width 181w of the dummy plug 181, and the width 182w of the dummy plug 182 is 20%-95% of the width 181w of the dummy plug 181. Similarly, a ratio of the difference between the width 182w of the dummy plug 182 and the width 183w of the dummy plug 183 with respect to the width 182w of the dummy plug 182 is 5%-80%, a ratio of the difference between the width 183w of the dummy plug 183 and the width 184w of the dummy plug 184 with respect to the width 183w of the dummy plug 183 is 5%-80%, and a ratio of the difference between the width 184w of the dummy plug 184 and the width 185w of the dummy plug 185 with respect to the width 184w of the dummy plug 184 is 5%-80%. At least two of the actual values of these width decreasing ratios may be the same, the actual values of these width decreasing ratios may be all the same, or the actual values of these width decreasing ratios may be all different from one another.

In one embodiment, the widths 181w-185w of the dummy plugs 181-185 are 0.15 µm, 0.14 µm, 0.13 µm, 0.12 µm, and 0.11 µm, respectively, the depths 181d-185d of the dummy plugs 181-185 are 0.55 µm, 0.50 µm, 0.45 µm, 0.40 µm, and 0.35 µm, respectively, and the spacings S between the dummy plugs 181-185 are all 0.1 µm. The distance D1 between the dummy plug 185 and the edge 130e of the gate 130 is 1.01 µm, and the second distance between the edge 130e of the gate 130 and the edge 140e of the drain region 140D is 3.0 µm.

In the embodiment, the semiconductor structure 100 may further include a gate contact 170, and the gate contact 170 is electrically connected to the gate 130, for example, the gate contact 170 is electrically connected to the gate conductive layer 134. The dummy contact 180 is electrically connected to the gate contact 170. For example, the dummy contact 180 may be electrically connected to the gate contact 170 via a wire layer 171. In one embodiment, the width 170w of the gate contact 170 is larger than the widths of the dummy plugs.

As shown in FIG. 1A, the semiconductor structure 100 may further include an isolation structure 110 formed in the substrate 102, and the dummy contact 180 is formed apart from the isolation structure 110.

In the embodiment, as shown in FIG. 1A, the semiconductor structure 100 may include at least a shallow trench isolation STI. The shallow trench isolation STI is formed in the substrate for providing electrical isolation between elements.

As shown in FIG. 1A, the semiconductor structure 100 may further include a first doping region 104 and a second doping region 120 formed in the substrate 102. The first doping region 104 has the first type conductivity, and the first doping region 104 is such as an N-type doping region. The second doping region 120 has the P type conductivity, and the second doping region 120 is such as a P-type doping region. The drain region 140D and the shallow trench isolation STI are formed in the first doping region 104. The source region 140S is formed in the second doping region 120.

As shown in FIG. 1A, the semiconductor structure 100 may further include a source contact 172 and a drain contact 174. The source contact 172 is electrically connected to the source region 140S, and the drain contact 174 is electrically connected to the drain region 140D.

Figure 2:
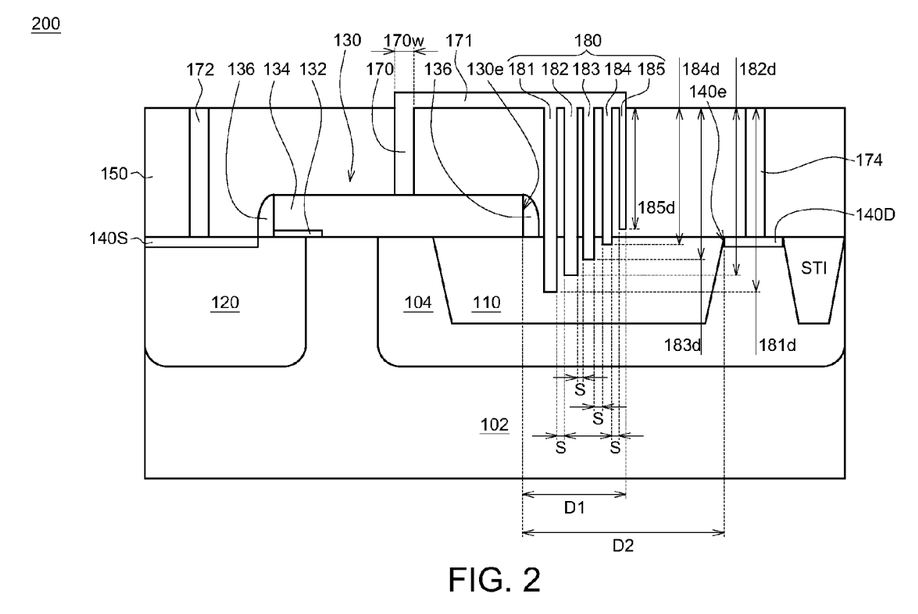
FIG. 2 is a schematic view of a semiconductor structure according to another embodiment of the present disclosure.

FIG. 2 is a schematic view of a semiconductor structure 200 according to another embodiment of the present disclosure. The elements in the present embodiment sharing the same labels with those in the previous embodiment are the same elements, and the description of which is omitted.

As shown in FIG. 2, the semiconductor structure 200 of the present embodiment is different from the semiconductor structure 100 of the precious embodiment mainly in that the isolation structure 110 is formed in the substrate 102, and at least a portion of the dummy contact 180 extends down into the isolation structure 110.

In the present embodiment, the isolation structure 110 is such as a field oxide (FOX) or a shallow trench isolation. As shown in FIG. 2, the dummy plugs 181-184 extend down into the isolation structure 110, and the dummy plug 185 does not extend down into the isolation structure 110. In other embodiments, the dummy plugs may all extend down into the isolation structure 110 (not shown in drawings).

Figure 3A:
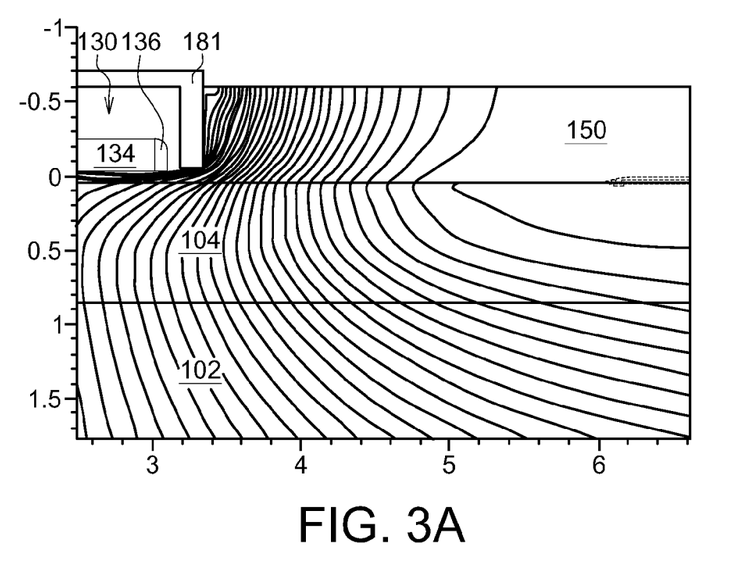
FIGS. 3A-3C illustrate distributions of electric field lines of a semiconductor structure according to an embodiment of the present disclosure.
Figure 3B:
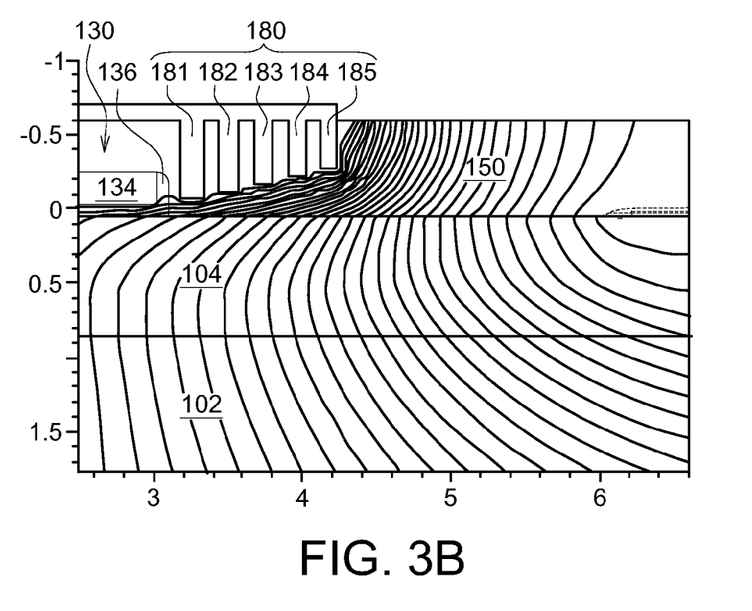
Figure 3C:
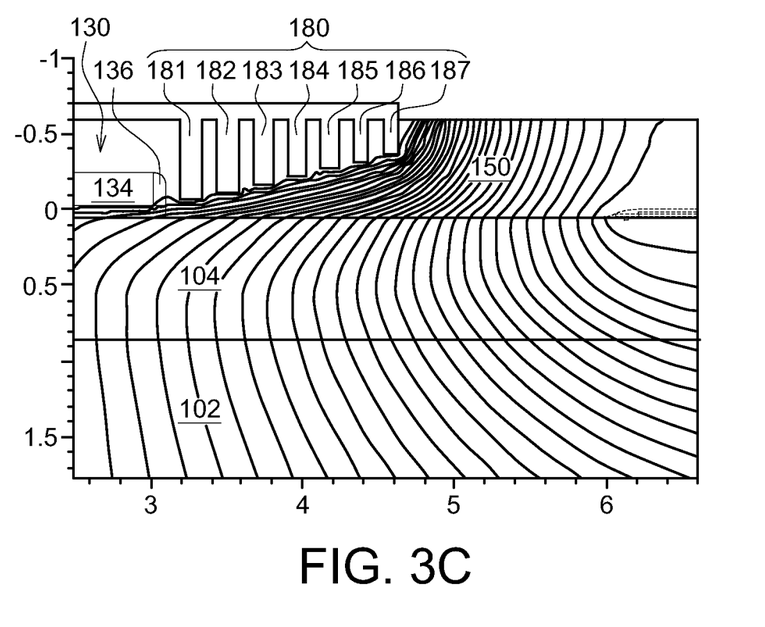

FIGS. 3A-3C illustrate distributions of electric field lines of a semiconductor structure according to an embodiment of the present disclosure. Specifically speaking, the semiconductor structures 100/200 may be used in HV MOS transistor devices.

The structure as shown in FIG. 3A only has one dummy plug 18, and the electric field lines are more concentrated in the region close to the gate conductive layer 134 (gate 130). In the structure as shown in FIG. 3B, the dummy contact 180 has five dummy plugs 181-185, and thus the electric field lines distribution in the region at the edge of the gate conductive layer 134 is more dispersed. Furthermore, in the structure as shown in FIG. 3C, the dummy contact 180 has seven dummy plugs 181-187, such that the electric field lines distribute towards the direction away from the gate 130, which is towards the drain region 140D; accordingly, the electric field lines can distribute more dispersedly in the region at the edge of the gate conductive layer 134. Thus, by arranging dummy plugs, the distribution of the electric field lines in the region at the edge of the gate conductive layer 134 can be less dispersed, thereby effectively increasing the breakdown voltage of the device.

Followings are embodiments and comparative embodiments. The devices of embodiments 1-8 include two dummy plugs to nine dummy plugs, respectively, and the depths of the dummy plugs are decreased towards the drain region 140D. The device of comparative embodiment 1 does not include any dummy contact, and the device of comparative embodiment 2 includes only one dummy plugs. The devices of comparative embodiments 2-9 include two dummy plugs to nine dummy plugs, respectively, these dummy plugs having the same depths. Table 1 below shows the numbers of dummy plugs, threshold voltages (VTO), linear drain currents (Id), on-resistances (Ron), and breakdown voltages (BVD) of embodiments 1-8 and comparative embodiments 1-10.

TABLE 1

|  | Embodiment 1 | Embodiment 2 | Embodiment 3 |
|---|---|---|---|
| Number of dummy plugs | 2 | 3 | 4 |
| VTO (V) | 1.2 | 1.2 | 1.2 |
| Idl (A) | 1.05E−04 | 1.05E−04 | 1.05E−04 |
| Ron (mohm*mm$^2$) | 86.1 | 85.7 | 85.6 |
| BVD (V) | 66.3 | 73.6 | 80.5 |

| Comparative Embodiment 1 | Comparative Embodiment 2 | Comparative Embodiment 3 | Comparative Embodiment 4 | Comparative Embodiment 5 |

TABLE 1-continued

|  | | | | | |
|---|---|---|---|---|---|
| Number of dummy plugs | 0 | 1 | 2 | 3 | 4 |
| VTO (V) | 1.2 | 1.2 | 1.2 | 1.2 | 1.2 |
| ldl (A) | 1.03E−04 | 1.04E−04 | 1.05E−04 | 1.06E−04 | 1.07E−04 |
| Ron (mohm*mm$^2$) | 87.5 | 86.6 | 85.8 | 85 | 84.3 |
| BVD (V) | 50.2 | 59.1 | 59.5 | 59.3 | 59 |
|  | Embodiment 4 | Embodiment 5 | Embodiment 6 | Embodiment 7 | Embodiment 8 |
| Number of dummy plugs | 5 | 6 | 7 | 8 | 9 |
| VTO (V) | 1.2 | 1.2 | 1.2 | 1.2 | 1.2 |
| ldl (A) | 1.06E−04 | 1.06E−04 | 1.06E−04 | 1.07E−04 | 1.07E−04 |
| Ron (mohm*mm$^2$) | 85.1 | 84.9 | 84.8 | 84.5 | 84.4 |
| BVD (V) | 85.5 | 88.3 | 89.3 | 88.8 | 87.7 |
|  | Comparative Embodiment 6 | Comparative Embodiment 7 | Comparative Embodiment 8 | Comparative Embodiment 9 | Comparative Embodiment 10 |
| Number of dummy plugs | 5 | 6 | 7 | 8 | 9 |
| VTO (V) | 1.2 | 1.2 | 1.2 | 1.2 | 1.2 |
| ldl (A) | 1.08E−04 | 1.09E−04 | 1.00E−04 | 1.10E−04 | 1.20E−04 |
| Ron (mohm*mm$^2$) | 83.4 | 82.6 | 81.9 | 81.2 | 80.4 |
| BVD (V) | 58.6 | 57.7 | 55.9 | 52.6 | 47.6 |

As shown in Table 1, when the device has dummy plugs having depths decreasing towards the drain region 140D, the electric field distribution can be more effectively dispersed, thereby increasing the breakdown voltage.

Figure 4A:
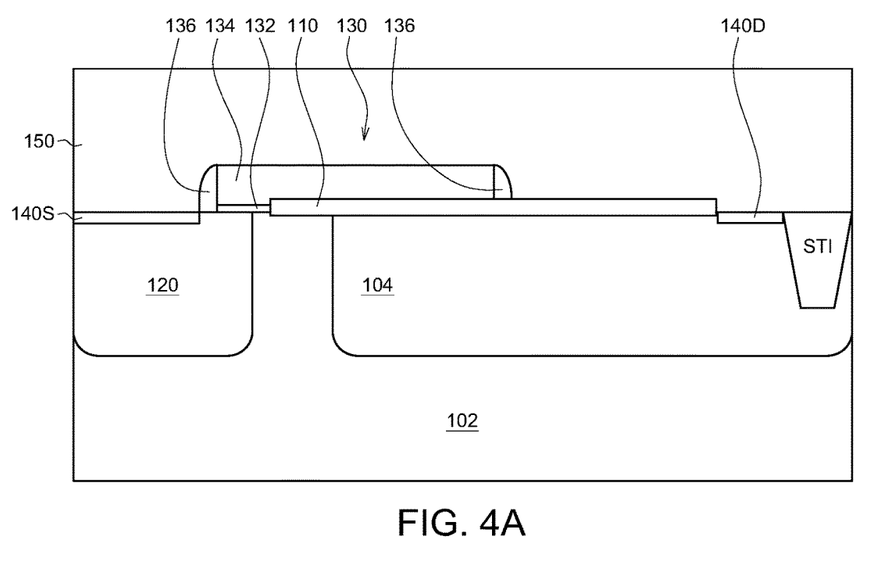
FIGS. 4A-4C illustrate a manufacturing method of a semiconductor structure according to an embodiment of the present disclosure.
Figure 4B:
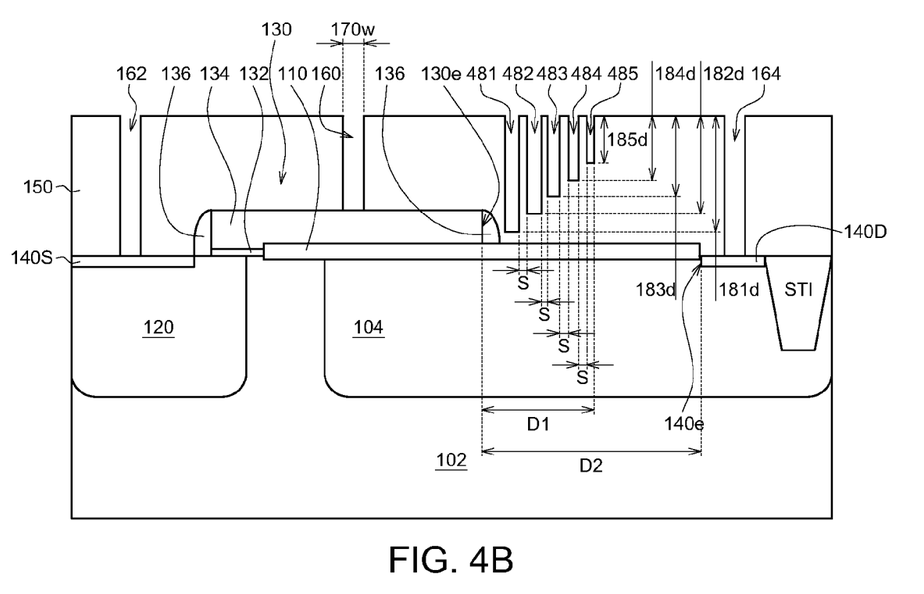
Figure 4C:
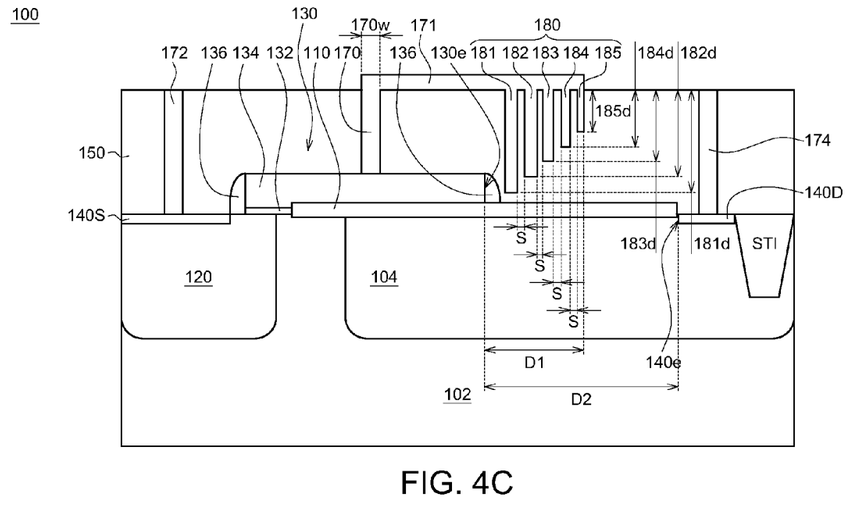

FIGS. 4A-4C illustrate a manufacturing method of a semiconductor structure according to an embodiment of the present disclosure.

As shown in FIG. 4A, the substrate 102 is provided, and the first doping region 104 and the second doping region 120 are formed in the substrate 102. The substrate 102 is such as a P-type silicon substrate, the first doping region 104 is such as an N-type doping region, and the second doping region 120 is such as a P-type doping region.

Moreover, the drain region 140D, the source region 140S, and at least one shallow trench isolation STI are formed in the substrate 102. The drain region 140D and the shallow trench isolation STI are formed in the first doping region 104, and the source region 140S is formed in the second doping region 120. Additionally, the isolation structure 110 is formed in the substrate 102.

Next, the gate 130 is formed on the substrate 102 and between the drain region 140D and the source region 140S. As shown in FIG. 4A, a gate dielectric layer 132 and the gate conductive layer 134 are formed on the substrate 102, and then the spacer 136 is formed on the sidewalls of the gate 130 (gate conductive layer 134). And then, an insulating material (150) is formed on the substrate 102.

As shown in FIG. 4B, a plurality of dummy plug holes 481-485 are formed in the insulating material. The dummy plug holes 481-485 have widths. Referring to FIG. 1A, the widths of these dummy plug holes respectively correspond to the widths of the dummy plugs 181-185 which will be formed subsequently. The widths of the dummy plug holes 481-485 are decreasing towards the drain region 140D, and the depths 181d-185d of the dummy plug holes 481-485 are decreasing towards the drain region 140D as well. As shown in FIG. 4B, these dummy plug holes 481-485 are separated from the isolation structure 110.

Specifically speaking, the dummy plug holes 481-485 may be formed by such as an etching process. By adjusting the widths of the dummy plug holes to make the widths of the dummy plug holes 481-485 decrease towards the drain region 140D, the dummy plug holes 481-485 formed by the etching process have depths 181d-185d decreasing towards the drain region 140D as well.

In addition, a gate contact hole 160 is formed in the insulating material. The width of the gate contact hole 160, which substantially equals to the width 170w of the gate contact 170 formed subsequently, is larger than the widths of the dummy plug holes 481-485.

In addition, a source contact hole 162 and a drain contact hole 164 are formed in the insulating material. In the embodiment, the dummy plug holes 481-485, the gate contact hole 160, the source contact hole 162, and the drain contact hole 164 may be formed in the same manufacturing process, for example, these holes may be formed by the same etching process.

Next, as shown in FIG. 4C, a conductive material is filled in the dummy plug holes 481-485 for forming the dummy plugs 181-185 of the dummy contact 180 on the substrate 102. The depths of the dummy contacts 181-185 decrease towards the drain region 140D. The conductive material is such as polysilicon or tungsten.

In addition, a conductive material is filled in the gate contact hole 160, the source contact hole 162, and the drain contact hole 164, for forming the gate contact 170, the source contact 172, and the drain contact 174, respectively. In the embodiment, the conductive materials used for forming the dummy plugs 181-185, the gate contact 170, the source contact 172, and the drain contact 174 may be the same or different.

As such, the semiconductor structure 100 as shown in FIG. 4C (FIG. 1A) is formed. The description of the semiconductor structure 100 is as described above and is omitted.

According to a manufacturing method of another embodiment, when forming the dummy plug holes 481-485, at least a portion of the dummy plug holes 481-485 may extend down into the isolation structure 110; for example, the depths of the dummy plug holes 481-484 extend down into the isolation structure 110, and the depth of the dummy plug hole 185 does not extend down into the isolation structure 110. As such, after the conductive material is filled into the dummy plug holes 481-485, the dummy plugs 181-185 as shown in FIG. 2 is formed.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
   a substrate;
   a source region and a drain region formed in the substrate;
   a gate formed on the substrate and between the source region and the drain region; and
   a dummy contact formed on the substrate, the dummy contact comprising a plurality of dummy plugs, wherein the dummy plugs have depths decreasing towards the drain region.

2. The semiconductor structure according to claim 1, further comprising:
   a gate contact electrically connected to the gate, wherein the dummy contact is electrically connected to the gate contact.

3. The semiconductor structure according to claim 1, further comprising:
   an isolation structure formed in the substrate, wherein the dummy contact is formed apart from the isolation structure.

4. The semiconductor structure according to claim 1, wherein the dummy plug with the smallest depth is separated from an edge of the gate by a first distance, the edge of the gate is separated from an edge of the drain region by a second distance, and a ratio of the first distance to the second distance is equal to or small than $2/3$.

5. The semiconductor structure according to claim 1, wherein the number of the dummy plugs is at least three, any two of the adjacent dummy plugs are separated by a spacing, and the spacings between the dummy plugs are the same.

6. The semiconductor structure according to claim 1, wherein the depths of the dummy plugs are decreasing by a depth interval of 0.01-0.2μm.

7. The semiconductor structure according to claim 1, wherein the depths of the dummy plugs are decreasing by a depth decreasing ratio of 1-30%, and the depth decreasing ratio is defined as a difference between the two depths to the larger one of the two depths of any two adjacent ones of the dummy plugs.

8. The semiconductor structure according to claim 1, wherein the dummy plugs have widths decreasing towards the drain region.

9. The semiconductor structure according to claim 8, wherein the widths of the dummy plugs are decreasing by a width interval of 0.01-0.1 μm.

10. The semiconductor structure according to claim 8, wherein the widths of the dummy plugs are decreasing by a width decreasing ratio of 5-80%, and the width decreasing ratio is defined as a difference between the two widths to the larger one of the two widths of any two adjacent ones of the dummy plugs.

11. The semiconductor structure according to claim 8, further comprising a gate contact electrically connected to the gate, wherein a width of the gate contact is larger than the widths of the dummy plugs.

12. A manufacturing method of a semiconductor structure, comprising:
    providing a substrate;
    forming a source region and a drain region in the substrate;
    forming a gate on the substrate and between the source region and the drain region; and
    forming a dummy contact on the substrate, the dummy contact comprising a plurality of dummy plugs, wherein the dummy plugs have depths decreasing towards the drain region.

13. The manufacturing method of the semiconductor structure according to claim 12, further comprising:
    forming a gate contact electrically connected to the gate, wherein the dummy contact is electrically connected to the gate contact.

14. The manufacturing method of the semiconductor structure according to claim 12, further comprising:
    forming an insulating material on the substrate; and
    forming a plurality of dummy plug holes in the insulating material, wherein the dummy plug holes have widths decreasing towards the drain region.

15. The manufacturing method of the semiconductor structure according to claim 14, further comprising:
    forming a gate contact hole in the insulating material, wherein a width of the gate contact hole is larger than the widths of the dummy plug holes.

16. The manufacturing method of the semiconductor structure according to claim 12, further comprising:
    forming an isolation structure in the substrate, wherein the dummy contact is formed apart from the isolation structure.

17. The manufacturing method of the semiconductor structure according to claim 12, wherein the dummy plug with the smallest depth is separated from an edge of the gate by a first distance, the edge of the gate is separated from an edge of the drain region by a second distance, and a ratio of the first distance to the second distance is equal to or small than $2/3$.

18. The manufacturing method of the semiconductor structure according to claim 12, wherein the depths of the dummy plugs are decreasing by a depth decreasing ratio of 1-30%, and the depth decreasing ratio is defined as a difference between the two depths to the larger one of the two depths of any two adjacent ones of the dummy plugs.

19. The manufacturing method of the semiconductor structure according to claim 12, wherein the dummy plugs have widths decreasing towards the drain region.

20. The manufacturing method of the semiconductor structure according to claim 19, wherein the widths of the dummy plugs are decreasing by a width decreasing ratio of 5-80%, and the width decreasing ratio is defined as a difference between the two widths to the larger one of the two widths of any two adjacent ones of the dummy plugs.

* * * * *